(12) United States Patent
Cai et al.

(10) Patent No.: US 9,905,594 B2
(45) Date of Patent: Feb. 27, 2018

(54) ARRAY SUBSTRATE, MANUFACTURING METHOD THEREOF AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Zhenfei Cai, Beijing (CN); Chuanwen Luo, Beijing (CN); Xinjie Zhang, Beijing (CN)

(73) Assignees: BOE TECHNOLOGY GROUP CO., LTD., Beijing (CN); HEFEI XINSHENG OPTOELECTRONICS TECHNOLOGY CO. LTD., Hefei, Anhui (CN)

( * ) Notice: Subject to any disclaimer, the term of this patent is extended or adjusted under 35 U.S.C. 154(b) by 0 days.

(21) Appl. No.: 15/279,156

(22) Filed: Sep. 28, 2016

(65) Prior Publication Data
US 2017/0221938 A1    Aug. 3, 2017

(30) Foreign Application Priority Data
Jan. 28, 2016 (CN) .......................... 2016 1 0060107

(51) Int. Cl.
*H01L 27/14* (2006.01)
*H01L 27/12* (2006.01)

(52) U.S. Cl.
CPC ........ *H01L 27/1296* (2013.01); *H01L 27/124* (2013.01); *H01L 27/1248* (2013.01); *H01L 27/1262* (2013.01)

(58) Field of Classification Search
CPC ............... H01L 27/1296; H01L 27/124; H01L 27/1248; H01L 27/1262
USPC .......................................................... 257/72
See application file for complete search history.

(56) References Cited

U.S. PATENT DOCUMENTS

2003/0231149 A1* 12/2003 Kawamura ....... G02F 1/134363 345/76
2014/0048883 A1*  2/2014 Ukeda ................. H01L 51/0529 257/347
2014/0054617 A1*  2/2014 Li ....................... H01L 27/1259 257/88

* cited by examiner

*Primary Examiner* — Anthony Ho
(74) *Attorney, Agent, or Firm* — Womble Bond Dickinson (US-LLP

(57) ABSTRACT

The present disclosure provides an array substrate, a manufacturing method thereof and a display device. The array substrate comprises a base substrate; a signal line and an electrode arranged in different layers on the base substrate, and an insulating layer located between the signal line and the electrode. The array substrate further comprises a dielectric film located between the signal line and the insulating layer, the dielectric film covering the signal line; and/or a dielectric film located between the electrode and the insulating layer, the dielectric film covering the electrode.

17 Claims, 5 Drawing Sheets

ARRAY SUBSTRATE, MANUFACTURING METHOD THEREOF AND DISPLAY DEVICE

RELATED APPLICATIONS

The present application claims the benefit of Chinese Patent Application No. 201610060107.4, filed on Jan. 28, 2016, the entire disclosure of which is incorporated herein by reference.

FIELD

The present disclosure relates to the field of display technologies, and particularly to an array substrate, a manufacturing method thereof and a display device.

BACKGROUND

At present, the thin film transistor liquid crystal display (TFT-LCD) is characterized by small volume, low power consumption, no radiation, etc, which is predominant in the current flat panel display market.

A TFT-LCD mainly comprises an array substrate and a color film substrate. During the process of producing the array substrate and the color film substrate, when film layers are deposited on the substrates, due to the large space of the equipment chamber, some foreign matters are easy to deposit on the substrates with the reactant gases. The foreign matters are likely to cause short circuit between some functional film layers on the substrate. For example, the foreign matters on the array substrate are likely to cause short circuit between the data line and the common electrode, resulting in signal interference.

SUMMARY

Embodiments of the present disclosure provide an array substrate, a manufacturing method thereof and a display device, which can prevent short circuit between the signal line and the electrode that results from the foreign matter in an insulating layer therebetween, improve the yield of the product, and reduce the power consumption of the product at the same time.

Accordingly, embodiments of the present disclosure provide an array substrate, comprising: a base substrate; a signal line and an electrode arranged in different layers on the base substrate, and an insulating layer located between the signal line and the electrode. The array substrate further comprises at least one of:

a dielectric film located between the signal line and the insulating layer, the dielectric film covering the signal line;

a dielectric film located between the electrode and the insulating layer, the dielectric film covering the electrode.

In an implementation, the signal line, the insulating layer and the electrode are arranged successively on the base substrate, and the dielectric film is only located on the surface of the signal line.

In an implementation, in the above array substrate provided by embodiments of the present disclosure, the area covered by the dielectric film is not smaller than the area of the covered signal line or electrode.

In an implementation, in the above array substrate provided by embodiments of the present disclosure, the orthographic projections of the insulating layer and the electrode on the base substrate both cover the orthographic projection of the dielectric film on the base substrate.

In an implementation, in the above array substrate provided by embodiments of the present disclosure, the dielectric film is an organic film.

In an implementation, in the above array substrate provided by embodiments of the present disclosure, the organic film comprises an organic material reserved on the surface of a pattern of the signal line at the time of manufacturing the signal line. In this case, the pattern of the signal line is made using the material of the organic film instead of the photoresist used in the prior art, which would not increase the number of lithography and would not reduce the aperture ratio of the product.

In an implementation, in the above array substrate provided by embodiments of the present disclosure, the organic film is formed by performing ashing treatment on the organic material reserved on the surface of the pattern of the signal line at the time of forming the pattern of the signal line. As used herein, "ashing" of an organic material or organic film is the process of etching the organic material or organic film as etching objects.

In an implementation, in the above array substrate provided by embodiments of the present disclosure, the signal line is at least one of a data line, a gate line, a control line and a touch control line.

In an implementation, in the above array substrate provided by embodiments of the present disclosure, the electrode is at least one of a common electrode, a pixel electrode, an electrostatic protective electrode and a touch control electrode.

In an implementation, in the above array substrate provided by embodiments of the present disclosure, the material of the organic film is includes a polyimide-type polymer material or an acrylic resin material.

Embodiments of the present disclosure further provide a manufacturing method of the array substrate as mentioned above, comprising:

forming, on a base substrate, patterns of a signal line, an electrode and an insulating layer between the signal line and the electrode arranged in stack.

The method further comprises at least one of the following steps:

forming a dielectric film located between the signal line and the insulating layer, the dielectric film covering the signal line;

forming a dielectric film located between the electrode and the insulating layer, the dielectric film covering the electrode.

In an implementation, in the manufacturing method of the array substrate as provided by embodiments of the present disclosure, the signal line, the insulating layer and the electrode are arranged on the base substrate successively, and the dielectric film is only located on a surface of the signal line.

In an implementation, in the manufacturing method of the array substrate as provided by embodiments of the present disclosure, the orthographic projections of the patterns of the insulating layer and the electrode on the base substrate both cover the orthographic projection of the pattern of the dielectric film on the base substrate.

In an implementation, in the manufacturing method of the array substrate as provided by embodiments of the present disclosure, the dielectric film is an organic film.

In an implementation, in the manufacturing method of the array substrate as provided by embodiments of the present disclosure, forming a pattern comprising a signal line and a dielectric film on the base substrate specifically comprises:

forming a conductive film layer and an organic material film layer in stack on the base substrate successively;

performing patterning process once on the conductive film layer and the organic material film layer to form patterns of a signal line and an organic film arranged in stack.

In an implementation, the manufacturing method of the array substrate as provided by embodiments of the present disclosure further comprises, after performing patterning process once on the conductive film layer and the organic material film layer to form patterns of a signal line and an organic film arranged in stack, performing ashing treatment on the pattern of the organic film.

Embodiments of the present disclosure further provide a display device comprising the above array substrate provided by embodiments of the present disclosure.

Embodiments of the present disclosure provide an array substrate, a manufacturing method thereof and a display device. The array substrate comprises a base substrate; a signal line and an electrode arranged in different layers on the base substrate, and an insulating layer located between the signal line and the electrode. The array substrate further comprises a dielectric film located between the signal line and the insulating layer, the dielectric film covering the signal line; and/or a dielectric film located between the electrode and the insulating layer, the dielectric film covering the electrode. Since the surface of the signal line and/or electrode on the array substrate provided by embodiments of the present disclosure is provided with a dielectric film, short circuit between the signal line and the electrode which results from the foreign matter in the insulating layer therebetween can be prevented, improving the yield of the product. Meanwhile, the distance between the signal line and the electrode is increased due to the presence of the dielectric film such that the parasitic capacitance is reduced to decrease the power consumption of the product.

DETAILED DESCRIPTION

Figure 1:
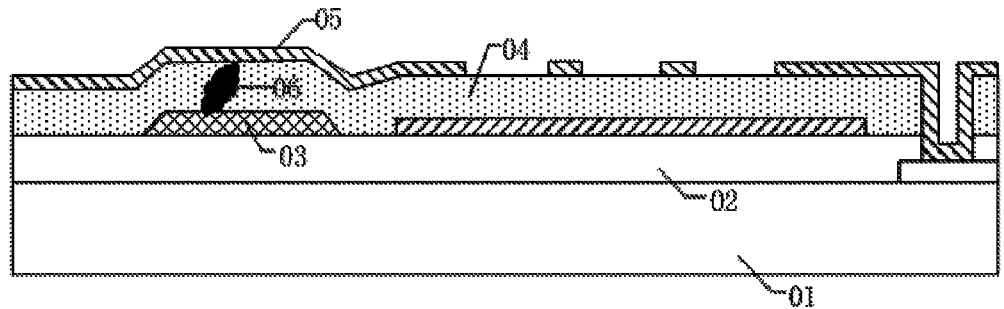
FIG. 1 is a structural schematic diagram of an array substrate in the prior art.

Implementations of the array substrate and manufacturing method thereof as well as the display device provided by embodiments of the present disclosure are set forth in detail below with reference to the drawings.

The thicknesses and shapes of respective film layers in the drawings do not reflect the real scale of the array substrate, which are only for the purpose of schematically illustrating the concept of the present disclosure.

In the prior art, taking an array substrate based on high advanced super dimension switch (HADS) mode as an example, as shown in FIG. 1, the array substrate comprises a base substrate 01, a first insulating layer 02, a data line 03, a second insulating layer 04 and a common electrode 05 arranged successively on the base substrate. During the process of depositing the second insulating layer, a foreign matter 6 is deposited in the second insulating layer 04 with the reactant gas. If the foreign matter 06 in the second insulating layer 04 falls on the data line 03, it would cause short circuit between the data line 03 and the common electrode 05, and there would also be mutual interference between the data signal transmitted by the data line and the common signal transmitted by the common electrode. Currently, this problem has been unable to be well improved and cannot be solved by any of the measures such as device cleaning.

Embodiments of the present disclosure provide an array substrate comprising: a base substrate; a signal line and an electrode arranged in different layers on the base substrate, and an insulating layer located between the signal line and the electrode. The array substrate further comprises a dielectric film located between the signal line and the insulating layer, and the dielectric film covers the signal line. Furthermore or alternatively, the array substrate further comprises a dielectric film located between the electrode and the insulating layer, and the dielectric film covers the electrode.

Implementations of the present disclosure are set forth below based on the example that the dielectric film covers the signal line. However, the dielectric film can also cover the electrode.

Figure 2:
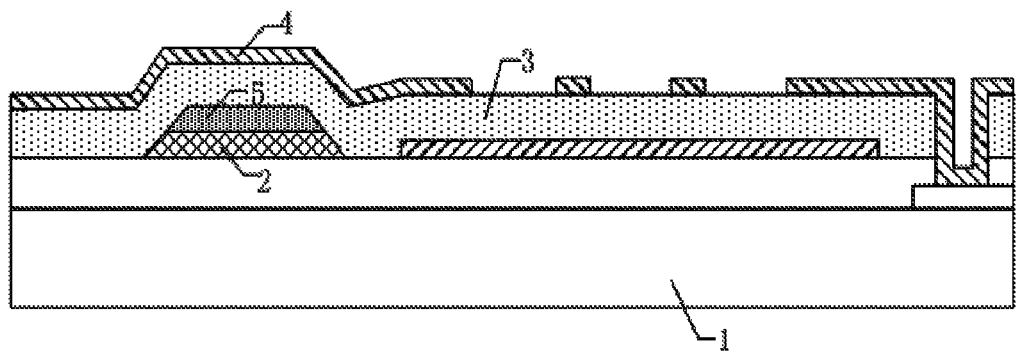
FIG. 2 is a structural schematic diagram of an array substrate provided by at least one embodiment of the present disclosure.

The array substrate shown in FIG. 2 comprises a base substrate 1, a signal line 2, an insulating layer 3 and an electrode 4 arranged successively on the base substrate, and a dielectric film 5 located on the surface of the signal line. In FIG. 2, based on the example that the signal line 2 is a data line and the electrode 4 is a common electrode, the electrode 4 and the insulating layer 3 are both located above the dielectric film 5, and the orthographic projections of the electrode 4 and the insulating layer 3 on the base substrate 1 both cover the orthographic projection of the dielectric film 5 on the base substrate 1.

The display mode of the above array substrate may be anyone of Twisted Nematic (TN) type, In Plane Switching (IPS) type, Advanced Super Dimension Switch (ADS) type or High Advanced Super Dimension Switch (HADS) type, etc, which is not limited here.

Since the surface of the signal line arranged in the array substrate is provided with the dielectric film, short circuit between the signal line and the electrode which results from the foreign matter in the insulating layer therebetween can be prevented, improving the yield of the product. Meanwhile, the distance between the signal line and the electrode is increased due to the presence of the dielectric film, such that the parasitic capacitance is reduced to decrease the power consumption of the product. Likewise, providing the dielectric film on the surface of the electrode can also achieve the above effect.

Figure 3:
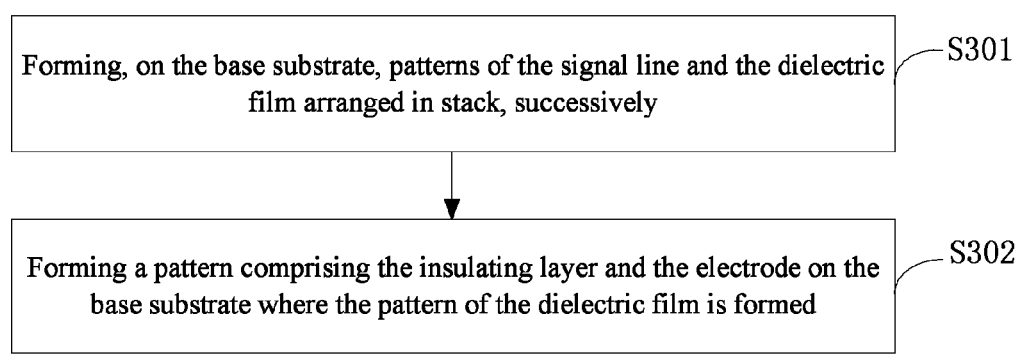
FIG. 3 is a flow chart illustrating a manufacturing method of an array substrate as provided by at least one embodiment of the present disclosure.

The area covered by the dielectric film is not smaller than that of the covered signal line or electrode. For example, as shown in FIG. 3, the dielectric film 5 covers the entire signal line 2 such that the signal line 2 is not in contact with the insulating layer 3.

Upon specific implementation, in the above array substrate provided by embodiments of the present disclosure, the signal line can be selected as a data line, a gate line, a control line, a touch control line or other structures capable of transmitting signals, which is not limited to the data line shown in FIG. 2. The selection of the signal line may depend on the practical situation, which is not defined here.

Upon specific implementation, in the above array substrate provided by embodiments of the present disclosure, the electrode can be selected as a common electrode, a pixel electrode, an electrostatic protective electrode, a touch control electrode or other electrode structures, which is not limited to the common electrode shown in FIG. 2. For example, in the ADS mode, a pixel electrode on the array substrate is located above the common electrode, and the electrode may be selected as a pixel electrode. In the TN mode, the array substrate is only provided with a pixel electrode, and the electrode may be selected as a pixel electrode. The selection of the electrode may depend on the practical situation, which is not defined here.

Upon specific implementation, in the above array substrate provided by embodiments of the present disclosure, as shown in FIG. 2, the pattern of the dielectric film 5 can be set to be identical with the pattern of the signal line 2. In this way, it is not only possible to ensure that the surface of the signal line is completely covered by the dielectric film to prevent the foreign matter in the insulating layer from falling on the signal line, but also possible to form the patterns of the dielectric film and the signal line by one and the same patterning process during the process of manufacturing the dielectric film and the signal line, thereby simplifying the manufacture process without increasing the number of masks and lithography.

Upon specific implementation, in the above array substrate provided by embodiments of the present disclosure, specifically as shown in FIG. 2, the orthographic projections of the insulating layer 3 and the electrode 4 on the base substrate 1 both cover the orthographic projection of the dielectric film 5 on the base substrate 1. In this case, the dielectric film can better prevent the foreign matter in the insulating layer from causing electrical connection between the signal line and the electrode.

Upon specific implementation, in the above array substrate provided by embodiments of the present disclosure, the dielectric film is specifically an organic film.

Upon specific implementation, in the above array substrate provided by embodiments of the present disclosure, specifically, an organic material reserved on the surface of the pattern of the signal line at the time of manufacturing the signal line can serve as the organic film. That is to say, the pattern of the signal line is made using the material of the organic film instead of the photoresist used in the prior art, which would not increase the number of lithography and would not reduce the aperture ratio of the product.

Further, upon specific implementation, in the above array substrate provided by embodiments of the present disclosure, the above organic material reserved on the surface of the pattern of the signal line can be subjected to ashing treatment, and the pattern formed after the ashing treatment can serve as the final organic film pattern. In this way, the ashing treatment of the organic film enables the organic film to achieve a desired thickness so as to ensure subsequent coating of the insulating layer and the electrode.

Upon specific implementation, in the above array substrate provided by embodiments of the present disclosure, the material of the organic film may be set as a polyamide-type polymer material or acrylic resin material. The selection of the material of the organic film may depend on the practical situation, which is not defined here.

Upon specific implementation, in the array substrate provided by embodiments of the present disclosure, the structures such as thin film transistor, gate line, common electrode line, and so on are further generally formed on the base substrate. These specific structures can be implemented in various manners, which are not defined here.

On the basis of the same concept, embodiments of the present disclosure further provide a manufacturing method of the above array substrate as provided by embodiments of the present disclosure. Since the principle of this method in solving problems is similar to that of the aforesaid array substrate, the implementation of this method may refer to the implementation of the array substrate, which will not be repeated for simplicity.

Upon specific implementation, as shown in FIG. 3, the manufacturing method of the array substrate as provided by embodiments of the present disclosure specifically comprises the following steps.

At step S301, forming, on the base substrate, patterns of the signal line and the dielectric film arranged in stack, successively.

At step S302, forming a pattern comprising the insulating layer and the electrode on the base substrate where the pattern of the dielectric film is formed. Upon specific implementation, in the manufacturing method of the above array substrate as provided by embodiments of the present disclosure, since the signal line and the dielectric film arranged in stack are formed in the array substrate, short circuit between the signal line and the electrode which results from the foreign matter in the insulating layer therebetween can be prevented, improving the yield of the product. Meanwhile, the distance between the signal line and the electrode is increased due to the presence of the dielectric film, such that the parasitic capacitance is reduced to decrease the power consumption of the product.

Alternatively, in another embodiment, patterns of the electrode and the dielectric film arranged in stack are first formed on the base substrate successively, and a pattern comprising the insulating layer and the signal line is then formed on the base substrate where the pattern of the dielectric film is formed.

Upon specific implementation, in the manufacturing method of the above array substrate as provided by embodiments of the present disclosure, the signal line, the insulating layer and the electrode are arranged on the base substrate successively, and the dielectric film is only located on the surface of the signal line.

Upon specific implementation, in the manufacturing method of the above array substrate as provided by embodiments of the present disclosure, the orthographic projections of the patterns of the insulating layer and the electrode on the base substrate both cover the orthographic projection of the pattern of the dielectric film on the base substrate.

Upon specific implementation, in the manufacturing method of the above array substrate as provided by embodiments of the present disclosure, the dielectric film is an organic film.

Figure 4:
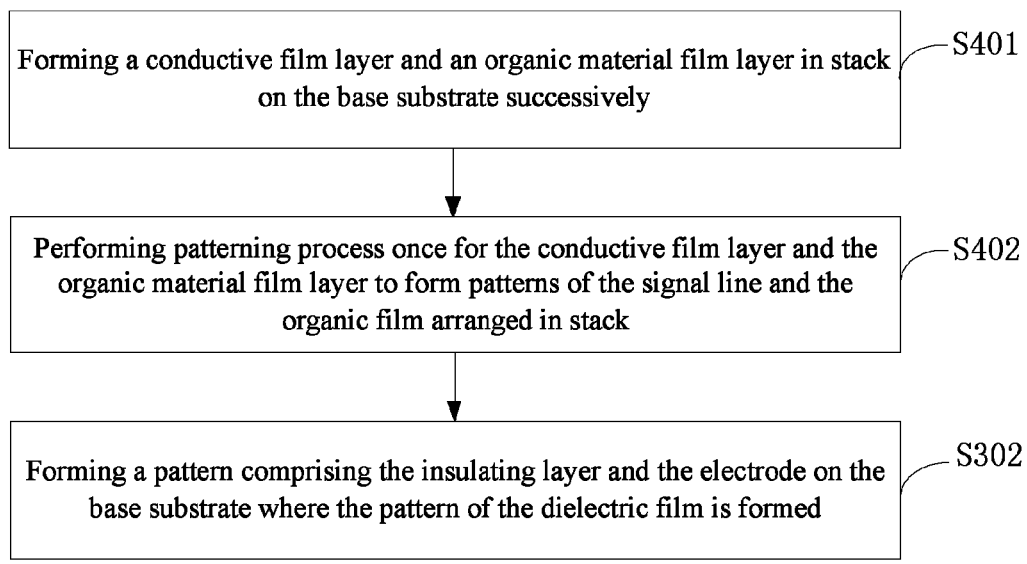
FIG. 4 is a flow chart illustrating a manufacturing method of an array substrate as provided by at least one embodiment of the present disclosure.

When the dielectric film is an organic film, in the manufacturing method of the above array substrate as provided by embodiments of the present disclosure, as shown in FIG. 4, step S301 of forming a pattern comprising the signal line and the dielectric film on the base substrate can be carried out specifically in the following manner.

In step S401, forming a conductive film layer and an organic material film layer in stack on the base substrate successively.

In step S402, performing patterning process once for the conductive film layer and the organic material film layer to form patterns of the signal line and the organic film arranged in stack.

Specifically, the conductive film layer and the organic material film layer can be exposed and developed simultaneously, and the patterns of the signal line and the organic film are then formed using wet etching process. As compared to the prior art, the organic film layer material here may be a photoresist. Namely, at the time of manufacturing the conductive film layer and performing patterning process, the photoresist is first exposed then developed, and finally stripped off. The photoresist above the data line is reserved while the photoresist is stripped off to form the pattern of the organic film of the present invention. The manufacture process flow can be therefore saved or simplified.

Figure 5:
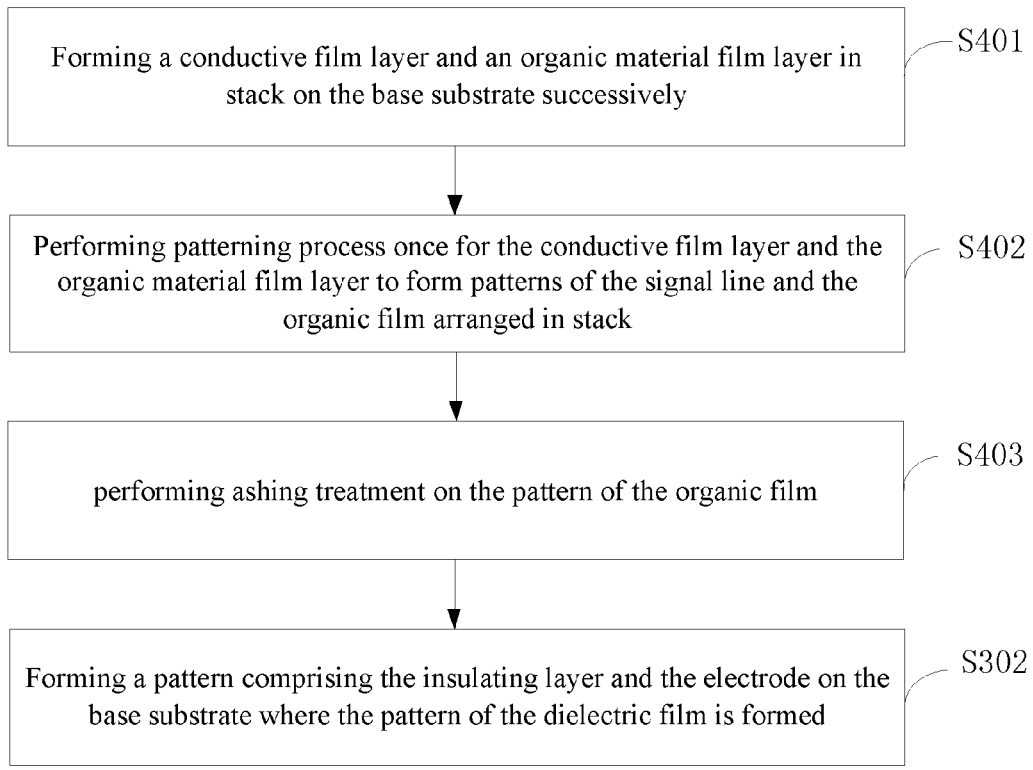
FIG. 5 is a flow chart illustrating a manufacturing method of an array substrate as provided by at least one embodiment of the present disclosure.

When the dielectric film is an organic film, the manufacturing method of the above array substrate as provided by embodiments of the present disclosure can further comprise, after carrying out step S402 of performing patterning process once for the conductive film layer and the organic material film layer to form patterns of the signal line and the organic film arranged in stack, as shown in FIG. 5, in step S403, performing ashing treatment on the pattern of the organic film.

In this way, performing ashing process on the pattern of the organic film (such as photoresist) enables the organic film to achieve a desired thickness and can ensure subsequent coating of the insulating layer and the electrode.

The manufacturing method of the array substrate as provided by embodiments of the present disclosure is set forth below in detail by virtue of one specific example, based on the example that the display mode is HADS and the dielectric film is an organic film.

Firstly, a conductive film layer and an organic material film layer are formed in stack on the base substrate successively, and the conductive film layer and the organic material film layer are exposed and developed.

Figure 6A:
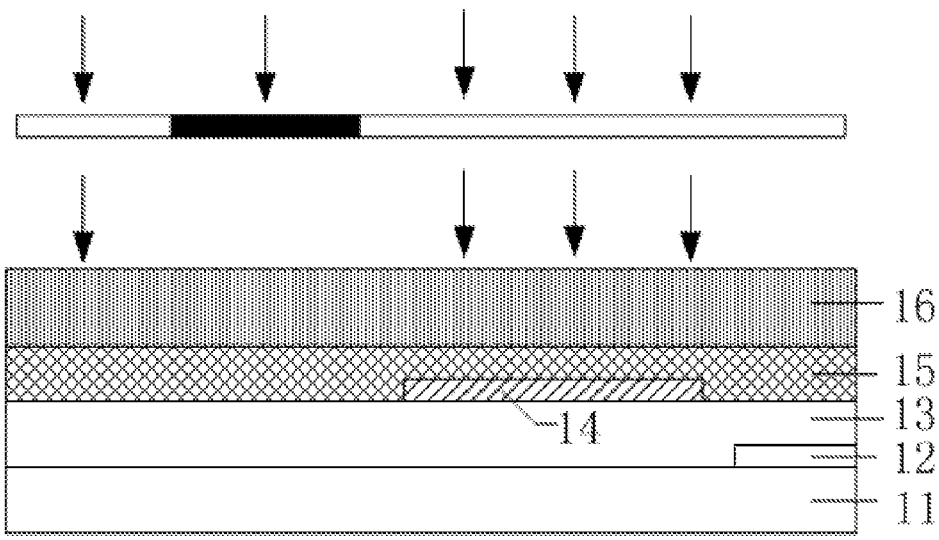
FIGS. 6a-6e are structural schematic diagrams showing the situations after respective steps of the manufacturing method of the array substrate as provided by embodiments of the present disclosure are carried out, respectively.

Upon specific implementation, as shown in FIG. 6a, a metal thin film is first deposited on a base substrate 11, and the patterns of the gate (not shown) and a common electrode line 12 are formed by exposure, development and wet etching process. A first insulating layer 13 is then formed on the base substrate 11 where the patterns of the gate and the common electrode line 12 are formed. A semiconductor layer is deposited on the first insulating layer 13, and the pattern (not shown) of the active layer is formed by dry etching process. An electrode layer is deposited on the pattern of the active layer, and the pattern of a pixel electrode 14 is formed by exposure, development and wet etching process. A conductive film layer 15 (which can also be called source/drain metal layer) is deposited on the base substrate where the pixel electrode 14 is formed, and then the surface of the conductive film layer 15 is coated with an organic material film layer 16. The conductive film layer 15 and the organic material film layer 16 are exposed and developed by means of the same mask.

Thereafter, wet etching process is performed on the conductive film layer and the organic material film layer after the exposure and development, to form the patterns of the signal line and the organic film arranged in stack.

Figure 6B:
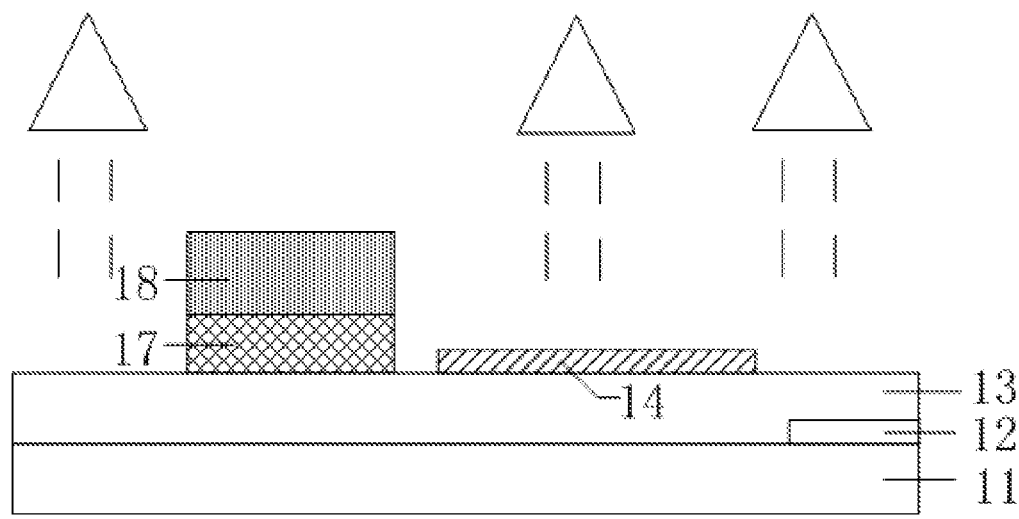

Upon specific implementation, as shown in FIG. 6b, wet etching process is performed on the conductive film layer 15 and the organic material film layer 16 after the exposure and development, to etch away the conductive film layer 15 and the organic material film layer 16 located in the pixel area to form the patterns of a signal line 17 (the signal line here is a data line) and an organic film 18 arranged in stack.

Thereafter, ashing treatment is performed on the pattern of the organic film.

Figure 6C:
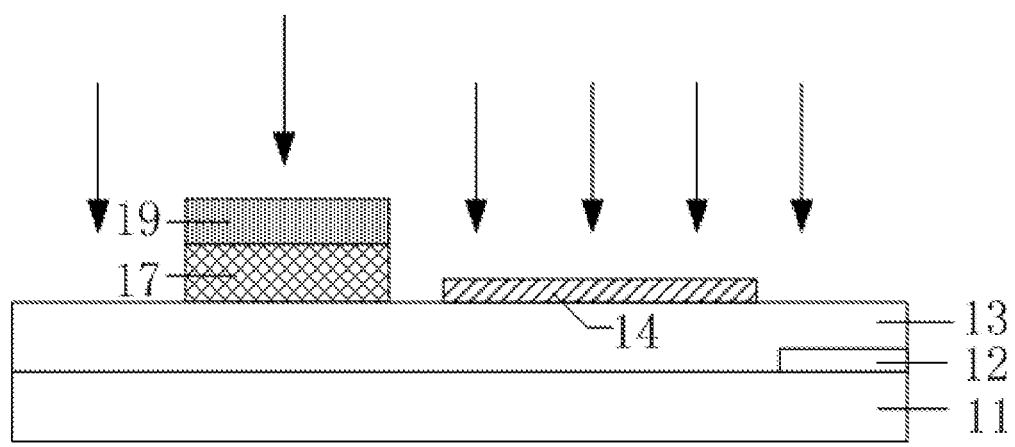

Upon specific implementation, as shown in FIG. 6c, ashing treatment is performed on the pattern of the organic film 18 on the surface of the signal line by a dry etching device. The ashing does not stop until a desired thickness is achieved, obtaining the pattern of a thinned organic film 19.

Thereafter, the pattern of the second insulating layer is formed on the base substrate where the pattern of the thinned organic film is formed.

Figure 6D:
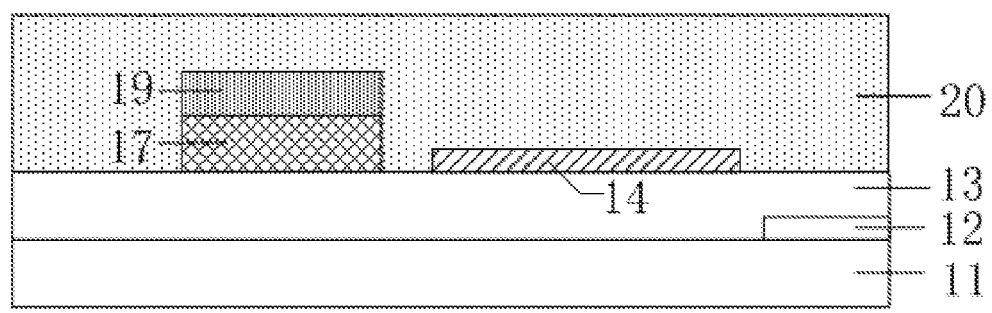

Upon specific implementation, as shown in FIG. 6d, a second insulating layer 20 is deposited on the base substrate where the pattern of the thinned organic film 19 is formed. Vias (not shown) are formed by exposure, development and dry etching. The orthographic projection of the second insulating layer 20 on the base substrate covers the orthographic projection of the pattern of the organic film 19 on the base substrate.

Finally, the pattern of the electrode is formed on the pattern of the second insulating layer.

Figure 6E:
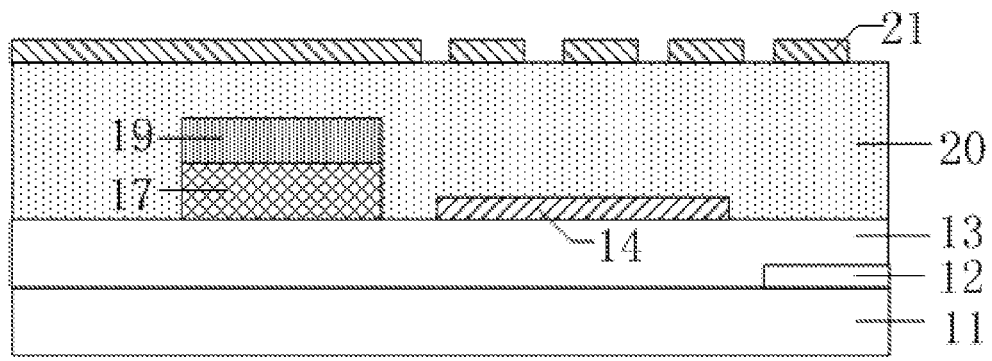

Upon specific implementation, as shown in FIG. 6e, an electrode layer (such as tin indium oxide ITO) is deposited on the pattern of the second insulating layer 20. The pattern of a slit-shaped electrode 21 (the electrode here is a common electrode) is formed by exposure, development and wet etching. The orthographic projection of the electrode 21 on the base substrate covers the orthographic projection of the pattern of the organic film 19 on the base substrate.

So far, the above array substrate provided by embodiments of the present disclosure is obtained through the above steps provided by specific examples.

On the basis of the same concept, embodiments of the present disclosure further provide a display device comprising the above array substrate provided by embodiments of the present disclosure. The display device may be any product or component having display function such as mobile phone, tablet computer, television, display, notebook computer, digital frame, navigator, and so on. Those ordinarily skilled in the art should understand that the display device has other necessary constituent parts, which will not be discussed here for simplicity and shall not limit the present disclosure. The implementations of the display device may refer to the embodiments of the above array substrate, which will not be repeated for simplicity.

Embodiments of the present disclosure provide an array substrate, a manufacturing method thereof and a display device. The array substrate comprises a base substrate; a signal line and an electrode arranged in different layers on the base substrate, and an insulating layer located between the signal line and the electrode. The array substrate further comprises a dielectric film located between the signal line and the insulating layer, the dielectric film covering the signal line; and/or a dielectric film located between the electrode and the insulating layer, the dielectric film covering the electrode. The surface of the signal line/electrode on the array substrate provided by embodiments of the present disclosure is provided with a dielectric film, which is a is non-conductive film layer and is not formed by film deposition technology but formed by coating or printing. When the dielectric film is manufactured, no conductive foreign matter would fall thereon, so it is non-conductive everywhere. Even if the insulating layer thereon is partially conductive due to the foreign matter, the conductive layers at two sides of the insulating layer would not be short-circuited. Consequently, short circuit between the signal line and the electrode which results from the foreign matter in the insulating layer therebetween can be effectively prevented, improving the yield of the product. Meanwhile, the distance between the signal line and the electrode is increased due to the presence of the dielectric film such that the parasitic capacitance is reduced to decrease the power consumption of the product.

Obviously, those skilled in the art can make various modifications and variations to the present disclosure without departing from the spirit and scope thereof. In this way, if these modifications and variations to the present disclosure pertain to the scope of the claims of the present disclosure and equivalent technologies thereof, the present disclosure also intends to encompass these modifications and variations.

The invention claimed is:

1. An array substrate, comprising a base substrate; a signal line and an electrode arranged in different layers on the base substrate, and an insulating layer located between the signal line and the electrode,
   wherein the signal line, the insulating layer and the electrode are arranged successively on the base substrate, and
   the array substrate further comprises
   a dielectric film located between the signal line and the insulating layer, the dielectric film covering the signal line and only located on a surface of the signal line.

2. The array substrate according to claim 1, wherein an area covered by the dielectric film is not smaller than the area of the covered signal line or electrode.

3. The array substrate according to claim 1, wherein orthographic projections of the insulating layer and the electrode on the base substrate both cover an orthographic projection of the dielectric film on the base substrate.

4. The array substrate according to claim 1, wherein the dielectric film is an organic film.

5. The array substrate according to claim 4, wherein the organic film comprises an organic material reserved on a surface of a pattern of the signal line at the time of manufacturing the signal line.

6. The array substrate according to claim 4, wherein the organic film is formed by performing ashing treatment on the organic material reserved on a surface of a pattern of the signal line at the time of forming the pattern of the signal line.

7. The array substrate according to claim 1, wherein the signal line is at least one of a data line, a gate line, a control line and a touch control line, and the electrode is at least one of a common electrode, a pixel electrode, an electrostatic protective electrode and a touch control electrode.

8. The array substrate according to claim 4, wherein a material of the organic film includes a polyimide-type polymer material or an acrylic resin material.

9. A manufacturing method of the array substrate according to claim 1, comprising:
   forming, on a base substrate, patterns of a signal line, an electrode and an insulating layer between the signal line and the electrode arranged in stack, wherein the signal line, the insulating layer and the electrode are arranged on the base substrate successively;
   the method further comprises at least one of the following steps:
   forming a dielectric film located between the signal line and the insulating layer, the dielectric film covering the signal line and only located on a surface of the signal line.

10. The manufacturing method according to claim 9, wherein orthographic projections of the patterns of the insulating layer and the electrode on the base substrate both cover an orthographic projection of the pattern of the dielectric film on the base substrate.

11. The manufacturing method according to claim 9, wherein the dielectric film is an organic film.

12. The manufacturing method according to claim 11, wherein forming a pattern comprising a signal line and a dielectric film on the base substrate comprises:
   forming a conductive film layer and an organic material film layer in stack on the base substrate successively;
   performing patterning process once on the conductive film layer and the organic material film layer to form patterns of a signal line and an organic film arranged in stack.

13. The manufacturing method according to claim 12, wherein after performing patterning process once on the conductive film layer and the organic material film layer to form patterns of a signal line and an organic film arranged in stack, further comprising:
   performing ashing treatment on the pattern of the organic film.

14. A display device comprising an array substrate, the array substrate comprising a base substrate; a signal line and an electrode arranged in different layers on the base substrate, an insulating layer located between the signal line and the electrode,
   wherein the signal line, the insulating layer and the electrode are arranged successively on the base substrate, and
   the array substrate further comprises a dielectric film located between the signal line and the insulating layer, the dielectric film covering the signal line and only located on a surface of the signal line.

15. The display device according to claim 14, wherein an area covered by the dielectric film is not smaller than the area of the covered signal line or electrode.

16. The display device according to claim 14, wherein orthographic projections of the insulating layer and the electrode on the base substrate both cover an orthographic projection of the dielectric film on the base substrate.

17. The display device according to claim 14, wherein the dielectric film is an organic film.

* * * * *